United States Patent [19]

Moss et al.

[11] Patent Number: 5,336,925
[45] Date of Patent: * Aug. 9, 1994

[54] POSITIVE WORKING POLYAMIC ACID/IMIDE PHOTORESIST COMPOSITIONS AND THEIR USE AS DIELECTRICS

[75] Inventors: Mary G. Moss; Terry Brewer; Ruth M. Cuzmar, all of Rolla; Dan W. Hawley; Tony D. Flaim, both of St. James, all of Mo.

[73] Assignee: Brewer Science, Inc., Rolla, Mo.

[*] Notice: The portion of the term of this patent subsequent to Aug. 11, 2009 has been disclaimed.

[21] Appl. No.: 827,342

[22] Filed: Jan. 29, 1992

Related U.S. Application Data

[60] Continuation of Ser. No. 606,460, Oct. 31, 1990, Pat. No. 5,138,424, which is a division of Ser. No. 268,023, Nov. 7, 1988, Pat. No. 5,024,922.

[51] Int. Cl.$^5$ .................................. H01L 29/34
[52] U.S. Cl. .................................. 257/643; 257/651; 257/759; 257/792
[58] Field of Search ................ 257/643, 651, 792, 759

[56] References Cited

U.S. PATENT DOCUMENTS 4,827,326  5/1989  Altman et al. .................. 257/759
4,927,736  5/1990  Mueller et al. .................. 430/275

Primary Examiner—J. Carroll
Attorney, Agent, or Firm—Veo Peoples, Jr.

[57] ABSTRACT

Positive working polyamic acid photoresist compositions are disclosed having improved high resolution upon image development and exhibiting stable photosensitivity and superior dielectric performance. The compositions comprise polyamic acid condensation products of an aromatic dianhydride and an aromatic di-primary amine wherein a percentage of the diamine comprises special dissolution inhibiting monomers. The compositions may be further improved by the presence of particular supplemental additives.

4 Claims, 2 Drawing Sheets

10- METAL LAYER.    11-POSITIVE POLYIMIDE LAYER.

Diamines for use in polyimide photoresist formulation.

Dianhydrides for use in polyimide photoresist formulation.

10 - METAL LAYER.    11 - POSITIVE POLYIMIDE LAYER.

1 - METAL LAYERS,  2 - POSITIVE POLYIMIDE LAYER,
3 - SILICON DIOXIDE LAYER.

POSITIVE WORKING POLYAMIC ACID/IMIDE PHOTORESIST COMPOSITIONS AND THEIR USE AS DIELECTRICS

This is a continuation of copending application Ser. No. 07/606,460 filed on Oct. 31, 1990, now U.S. Pat. No. 5,138,424, which is a division of application Ser. No. 07/268,023, filed Nov. 7, 1988, now matured into U.S. Pat. No. 5,024,922.

BACKGROUND OF THE INVENTION

1. Field of the Invention

The present invention relates to positive working polyamic acid photoresist compositions and their use as dielectrics, and particularly to improvements in imagewise resolution upon photo image development.

2. Description of the Prior Art

Photoresist compositions, generally, are well-known in the art as coatings comprising a diazoquinone photo sensitizer and a resinous binder. These compositions are coated or deposited onto certain substrates and when exposed to light of proper wave length (irradiated) the compositions are chemically altered in their solubility to certain solvents (developers). This process is known as photoimage development.

Two types of photoresist compositions are known, namely; negative working and positive working photoresist. The negative working resists are compositions which are initially soluble in the developers, but following irradiation become insoluble. Accordingly, by configuring a specific pattern or irradiation, during photoimage development, those areas of the coating exposed to the light will form raised lines which define negative images. Positive working photoresist compositions work in the opposite fashion. That is, the compositions are initially insoluble in alkaline developer and accordingly, irradiation the exposed regions dissolve and form indented lines or cavities that define positive images.

The clarity and precision with which these lines are formed, called resolution, is calibrated in microns of geometry.

In the microelectronics industry, it is important to achieve line resolutions as small as possible, preferably one micron or smaller for coating thicknesses within the range of one to two microns. It is also desirable to employ positive working photoresist rather than negative working photoresist in dielectric applications. The recessed lines formed in the coating from the positive resist will better serve dielectric applications than will raised lines formed from negative resist because in dielectric applications, unlike many other applications, the bulk of the coating remains on the wafer during subsequent processing. Additionally, modern techniques for processing semi-conductors call for plasma and sputter etching, ion beam implantation, and the like, which require photoresist compositions having stability at temperatures as high as 300° and higher. When photoresist compositions are employed as dielectric layers, not only is thermal stability essential, but the resist must also maintain good dielectric properties.

Over the years, polyamic acid condensation resins produced from an aromatic dianhydride and an aromatic di-primary amine, such as those described in U.S. Pat. No. 3,179,634, have received widespread attention as resinous binders for photoresist compositions because they are readily converted by heat to thermally stable polyimides. They are resistant to dilute acids and organic solvents and they are heat stable at temperatures in excess of 400° C. However, because of the high solubility of the polyamic acid in alkaline-developer, prior to conversion to the imide, their use has been restricted for the most part to negative working photoresist compositions.

The earliest of these negative working polyamic acid photoresist was disclosed in U.S. Pat. No. 3,623,870. Therein, a negative working photoresist composition was disclosed comprising a mixture of photosensitive dichromate and the polyamic acid binder. The composition was initially soluble in the developer and upon photoimaging, the dichromate cross-linked the polyamic acid binder causing the exposed areas to become less soluble than the uncross-linked polyamic acid of the unexposed areas. Thus, development was said to proceed via different rates of solubility between imagewise exposed and non-exposed areas. It was found, however, to be difficult, if at all possible, to prevent some attack by the developer solvent on the non-exposed areas; accordingly, the problems associated with obtaining good resolution from polyamic acid systems arose even in negative working polyamic acid photoresist compositions.

More recently, in U.S. Pat. No. 4,451,551, polyamic acids photosensitized with a compound having an amino group and an aromatic azide group were disclosed in a negative working photoresist composition. After photoimage development, the composition was baked at from 150° to 300° C. to produce a heat resistant polyimide that resisted distortions when heated to 400° C. for an hour and was used as dry-etching resistant photoresist. Again, the composition was initially soluble in the developer and the unexposed portions remained soluble, while the irradiated portions were rendered relatively less soluble for the formation of negative patterns.

More recently, in U.S. Pat. No. 4,515,887, a negative working polyamic acid photoresist specifically designed for use as a dielectric was disclosed. Therein, the base resin was produced by a condensation reaction between aromatic dianhydride and a mixture of aromatic diamine plus amine organo terminated polydiorganosiloxane. The resultant silicone-polyamic acid was modified by a mixture of isocyanato organoacrylate which enabled the polymer to be sensitized with an appropriate photo sensitizer such as Michler's ketone or benzophenone. The composition was then spin coated onto the substrate and heated to 100° C. for partial imidization. Upon exposure to ultra-violet light in alkaline developer solution cross-linking occurred capable of insolubilizing the exposed areas and creating a negative patterned dielectric layer on its surface.

Even more recently in U.S. Pat. No. 4,656,116, a negative working polyamic acid photoresist composition was disclosed wherein aromatic tetracarboxylic acid derivatives and aromatic diamines having both ortho-positions relative to the phenylene radical bonded to an imide group of the polymer an substituted by alkyl groups where radiation-crosslinked with organic chromophoric polyazides. The compositions were useful in preparing dielectric layers and for producing printed circuits and integrated circuits.

Several problems associated with the use of negative working polyamic acid photoresists for imagable dielectric layers could be overcome if positive working photoresists were used. In the first place, dielectric applications commonly require that holes be patterned in the existing coating. Hole patterning is most effectively accomplished through the use of a positive resist, in which the exposed areas are removed. In addition, a slight side slope is desired in order to achieve effective metal contacts. Positive resists naturally achieve the necessary sloping sidewalls because the top of the film receives a higher exposure than the bottom of the film, and is therefore slightly more soluble. The slope produced in a negative resist is in the opposite direction from that desired, because solubility is inversely related to exposure. A third advantage of positive resist is especially important in thick films where absorption of the film can greatly decrease sensitivity. Positive resists photobelach—that is, the absorption coefficient decreases upon exposure, enabling more light to reach the lower regions of the film, and increasing exposure efficiency. For these reasons, a positive resist is preferable to a negative resist for dielectric applications.

The earliest attempts to make thermally stable polyamic acid photoresist compositions in a positive working fashion was disclosed in U.S. Pat. No. 4,093,461. Therein, it was attempted to make the polyamic acid condensation resin insoluble in an alkaline developer by admixture with orthoquinone and orthonaphthoquinone diazide photosensitizers. It was believed that sufficient quantities of the diazide sensitizer would render the unexposed areas of the photoresist composition completely insoluble in the aqueous alkaline developing solution because of the hydrophobicity and insolubility of the diazides themselves before photolysis or photoimage development. Hence, a positive image could be formed on the support corresponding to the master pattern of configurated irradiation used during the photoimage development. It was believed that a difference in solvation was required to create the positive working phenomenon and/or complete insolubility in the developer as by use of large quantities of the photosensitizer particularly the abietyl types of diazides.

By use of this different solvation, it was believed that sharp distinctions between imagewise exposed and non-exposed areas during development would occur and thus ensure that only light-struck areas were dissolved in the developer; whereas non-exposed areas would remain insoluble and unaffected in the developer. However, such attempts have had only limited success in that polyimide-based photoresist systems exhibit such a high dissolution rate in alkaline solutions with conventional, commercially available diazide sensitizers, that adequate control over processes to obtain high resolution is not possible.

Attempts to decrease the dissolution rate under the teachings of U.S. Pat. No. 4,093,461, by increasing the concentration of the sensitizer in the photoresist to as high as 50% by weight have been problematic for two reasons: (1) The concomitant increase in optical density of the photoresist inhibits full penetration of the film thickness by the radiation source, and (2) there is a progressive reduction in thermal stability of the photoresist associated with increased concentration of the sensitizer.

More recently, positive working polyamic photoresist compositions have been designed to overcome the problems associated with increased sensitizer concentration.

In European Patent Application No. 224,680, it is disclosed that by reducing the acidity of the polyamic acid by about 10 to about 40% of its original value, the dissolution rate of the initial unexposed photoresist composition in the alkaline developer and the subsequent dissolution rate of the exposed areas could be controlled to provide a tailored development rate within a desired range. This reduction in acidity is achieved by, for example, pre-baking to achieve partial imidization; or partial neutralization with basic organic reagents including the use of blends of the polyamic acid and its ester derivatives or co-polymers of the acid and esters derived from the organic reagents. However, pre-baking to achieve partial imidization is therein taught to be limited in the extent to which it could be employed to reduce acidity because temperatures above about 100° C. as for example, even 120° C., caused loss of photosensitivity by degradation of the diazoquinone photosensitizers. Furthermore, acidity reduction through employment of the basic organic reagents, therein disclosed, tends to corrode the conductors found in integrated circuits. Small mobile impurities, created therefrom, tend to degrade dielectric performance.

Accordingly, in spite of the fact that the microelectronics industry's manufacturing processes are based almost exclusively on positive photoresist techniques, those more desirable thermally stable polyamic acid photoresists which are of any practical utility continue to be negative working. The most prevalent commercially available positive photoresist compositions continue to consist of base resins made from phenol-formaldehyde condensation products such as Novolacs. These Novolac based photoresists, when mixed with standard photosensitizers, become insoluble and thereafter allow exposed areas during irradiation or photodevelopment to become soluble. Novolac melts at temperatures above about 150° C. with the result that such systems are not suitable for the modern technology high temperature applications, particularly as interlayer dielectric coatings for integrated circuits.

It would therefore be a substantial advancement in the art to develop a positive working polyamic acid photoresist composition which was devoid of the above-described drawbacks in the prior art.

SUMMARY OF THE INVENTION

It is a principal object of the present invention to provide a novel positive working polyamic acid photoresist composition capable of pre-baking at above 120° C. prior to photoimage development without loss of its photosensitivity or resolution.

It is a further principal object of the present invention to provide a novel positive working polyamic acid photoresist without the basic organic reageants which give rise to degradation of dielectric performance.

It is a still further object of the present invention to provide a positive working polyamic acid photoresist composition which exhibits high resolution at less than two micron geometries.

It is an additional object of the present invention to provide dielectric insulating layers, photoimagable at high resolutions and of high thermal stability from positive working polyamic acid photoresist where removal of the resist prior to baking is negated.

These objects and others which will become apparent from the following detailed description and examples of the invention are made possible by a polyamic acid composition comprising at least 10% of particular diamine monomers and by the addition of particular supplemental additives.

BRIEF DESCRIPTION OF THE DRAWINGS

The inventive and distinctive features of the invention are set forth in the claims. The invention itself, however, taken with further objects and advantages thereof may best be understood by reference to the following description and the accompanying drawings in which:

DETAILED DESCRIPTION OF THE PREFERRED EMBODIMENTS

Polyamic acid solubility in basic developer is very dependent upon the presence of excess acidic or basic groups, and as a result, polyamic acid is especially well suited to the production of a positive photoresist. In forming a polyimide-based resist based on diazonaphthoquinone sensitizer chemistry, the choice of the base polyimide chemistry is critical. Most commonly, polyamic acid solubility is regulated by thermally converting some of the carboxylic acid groups to imides, which are not base-soluble. The percentage of imidization is a function of the time of heating and the temperature. For many common polyamic acids, such as the polyimide precursor made from pyromellitic dianhydride and 4,4'-oxydianiline, temperatures in the range of 160° C.-170° C. are required to achieve the desired etch rate in aqueous basic developer.

Because they contain highly reactive diazo groups, sensitizers based on diazonaphthoquinone are degraded at high temperatures. The degradation products are not photosensitive, and in fact can be detrimental to the lithographic properties because of the formation of insoluble film due to crosslinking. Degradation of the sensitizer follows first-order kinetics. The half-life of decomposition at 130° C. is eight minutes. By 150° C., the half-life decreases to 90 seconds. Proper removal of solvent requires a hotplate bake of at least 90 seconds. Thus, a low resist bake temperature is desirable to achieve the optimum sensitivity and resolution without scumming.

The results on sensitizer degradation demonstrate that unmodified PMDA-ODA polyamic acid cannot be used in a polyimide resist using diazonaphthoquinone sensitizers because regulation of the solubility by baking requires temperatures that destroy the sensitizer. This fact has been previously stated in EPO patent application 224 680. The mixing of a high percentage of sensitizer into the polyamic acid gives the polymer the required solubility. However, at these concentrations, the absorbance is so great that the bottom of the film remains unexposed while the tope of the film is overexposed. The applicants' invention consists of polyamic acid resist formulations in which the solubility of the polyamic acid is reduced in one or more of the following ways: by incorporating into the polyimide structure one of a class of specific diamine monomers of a type that reduce the intrinsic solubility of the polymer by the addition of a second polymer which itself has low solubility in developer, or by the addition of a cyclic aliphatic diepoxide.

Figure 1:
FIG. 1 is an illustration of diamines for use in polyimide photoresist formulation.
Figure 1:
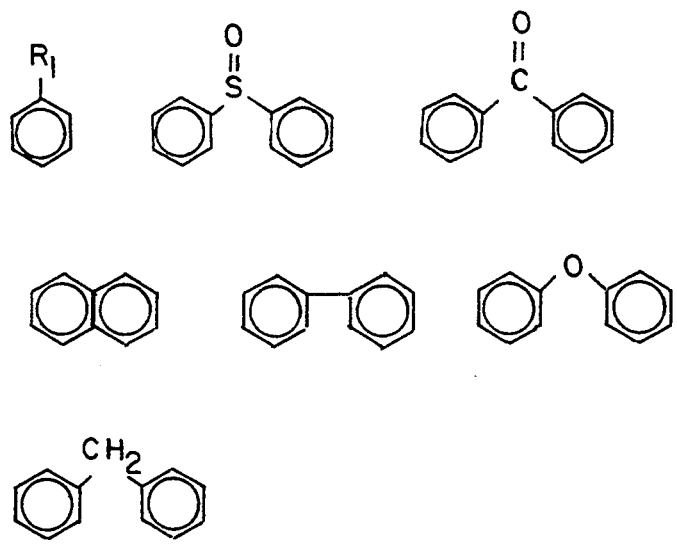
Figure 2:
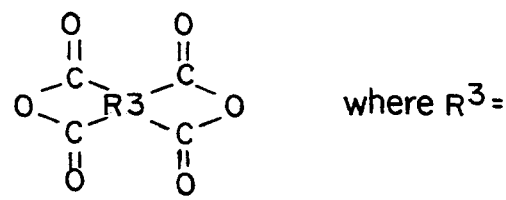
FIG. 2 is an illustration of dyanhydrides for use in polyimide photoresist formulations.
Figure 2:
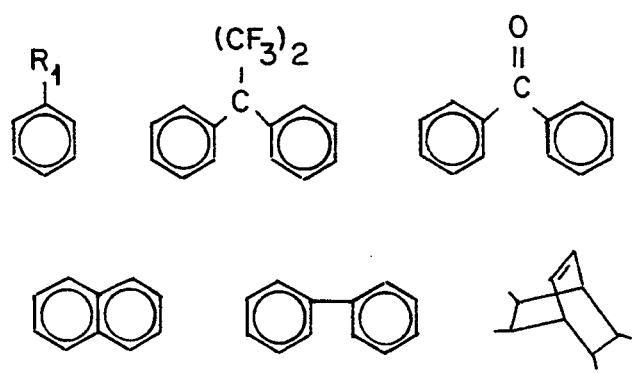

A generalized structure of the base polyamic acid is as follows:

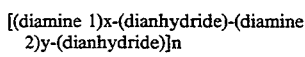

where diamine 1 (has the formula:

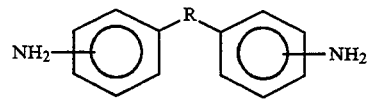

where R contains one or more phenyl rings connected by oxygen, $SO_2$, alkyl, fluoroalkyl, or biphenyl linkages, diamine 2 is selected from the group of diamines shown in FIG. 1, the dianhydride is selected from the group of dianhydrides shown in FIG. 2, and the mole ratio of x to y ranges from 100%; to 5%, preferably 55% to 20%; depending upon the desired solubility and desired raw material source. The bake temperature required to achieve low solubility can be controlled by adjusting the ratio of diamine 1 to diamine 2.

Thus, a polyamic acid in which a percentage of the diamine is as above-described, preferably either bis-4(4-aminophenoxy) phenyl sulfone (BAPS) or bis-4(4-aminophenoxy) phenyl propane (BAPP) has the required solubility in developer following a prebake of from about 110° C. to 150° C. but preferably 135° C. bake temperature. It is expected that the high aromaticity of the diamine provides the means by which solubility is reduced. In order to regulate the developing rate, a mixture of diamines is used in which one diamine is BAPS or BAPP and the other diamine is of the general structure shown in FIG. 1. For polymers made with BAPP, approximately 10–20 mole % of the total diamine produces a polymer with the proper solubility; for BAPS, approximately 45 mole % of the total diamine is required.

Examples of dianhydrides that can be used to fore positive-working polyimide dielectric, mixtures are pyromellitic dianhydride, 6F dianhydride, biphenyl tetracarboxylic dianhydride, naphthalene tetracarboxylic dianhydride, benzophenone tetracarboxylic dianhydride, and bicyclodianhydride. A generalized structure of dianhydrides is shown in FIG. 2.

The above polyamic acid can be mixed with a second polymer to improve the developing latitude. Novolac in percentages of approximately 10–20% improves the shape of the line profiles and improves the reproducibility of the development rate. Other additives which perform the same function are dimethylaminobenzaldehyde, diisopropyl amine, trihexyl amine, dibenzyl amine, N-(triethoxysilylpropyl) urea, p-dimethylamino benzaldehyde, or isocyanatopropyltriethoxysilane. These additives cause greater solubility difference between the exposed and unexposed regions.

The base polyamic acid can be mixed with a polyurethane in percentages lower than 5% to further slow the developing rate. The use of a polymeric additive to slow development rate is expected to be advantageous from the standpoint of dielectric properties because the tendency to outgas to form pinholes is less. A second advantage of the polymeric additive is that, even in small percentages, it makes a significant contribution to the film thickness because of its high molecular weight.

The base polyamic acid can be mixed with a cyclo aliphatic diepoxide, examples of which are 3,4-epoxycyclohexylmethyl-3',4'-epoxycyclohexane carboxylate or the Cyracure UVR crosslinking agents sold by Union Carbide, to slow development rate. It is expected that the epoxy groups react with the carboxylic acids during the bake step to retard solubility.

The polymers are synthesized by condensation of the diamines with the dianhydrides in a solvent such as N-methylpyrrolidinone, dimethylacetamide, dimethylformamide, or a mixture of the above with a nonsolvent such as diglyme, 2-methoxyethylacetate, or other ketones, ethers, or aromatic solvents. The formulations containing solvent/nonsolvent mixtures have superior spin-coating properties.

Besides the choice of monomer, the molecular weight of the polymer is important to the resolution capability. If the molecular weight is too high, incomplete development and scumming occurs. If the molecular weight is too low, the polymer is too soluble in the unexposed areas. As a result, triangular line profiles limit the attainable resolution in low molecular weight polymer. The molecular weight can be limited by adjusting the mole ratio of the two types of monomers (dianhydride and diamine). The actual molecular weight range is dependent upon the desired film thickness.

For thicker photoresist films (greater than 5 microns), the absorption of the base polymer at the exposure wavelength becomes critical because of attenuation of the exposing radiation at lower regions of the film. Table 1 shows polymers, absorbances, and percentages of incident light transmitted ($I/I_o \times 100$) at the bottom of a 10 micron film. Novolac, which is commonly used in positive photoresist formulations, has an absorbance in the same range as the absorbance of the BTDA-BAPS/4APS polymer described here. For thicker film resists, the absorbance can be greatly decreased by the substitution of BTDA with a monomer such as 5 (2,5-dioxotetrahydrofuryl)-3-methyl-3-cyclohexene-1,1-dicarboxylic anhydride, which is sold by Dianippon as Epiclon B-4400. Absorbances of the polymer of Epiclon B4400 with BAPS and 4APS are shown in Table 1, and it can be seen that this polymer has a much more preferable absorbance than the polymer containing BTDA.

TABLE 1

| | Transmission of exposure of selected polymers at 10 micron depth | | | | | |
|---|---|---|---|---|---|---|
| | Absorbance of 10μ film at wavelength (nm) | | | % transmitted at bottom of 10μ film | | |
| Polymer | 365 | 405 | 436 | 365 | 405 | 436 |
| Novolac | 1.03 | 0.48 | 0.39 | 9 | 32 | 41 |
| BAPS[1] | 2.15 | 0.45 | 0.21 | 1 | 35 | 61 |
| EPI[2] | 0.08 | 0.05 | 0.04 | 83 | 89 | 91 |

[1]BAPS denotes the BTDA-BAPS/4APS polymer of Example 3.
[2]EPI denotes a polymer identical to 1 above, except substituting an equimolar amount of Epiclon B4400 (available from Dianippon Chemical) for the BTDA.

The photoactive sensitizer is the 1-oxo-2-diazo-naphthalene-5-sulfonic acid ester of 2,3,4-trihydroxybenzophenone. Sensitizer from two manufacturers were used: Fairmount #1006 and ICI #155. Both products have similar performance.

An adhesion promoter such as a bifunctional silane which can couple to the surface and also to the polymer, an example of which is methacryloxypropyl trimethoxy silane, is spun onto the wafer before the polyimide resist. The photosensitive polyimide compositions are then spin-coated to the desired thickness. The films are heated to evaporate solvent by baking on a hotplate at a temperature from 100°–140° C. for about 90 seconds. In place of the hot plate, the films can be baked in a convection oven.

The photosensitive polyimide Is then exposed to ultraviolet radiation. Exposure can be either through a mask or by a directed beam of radiation. Patterns are distinguished by developing in aqueous basic developer solution. Examples of developer are those containing tetramethylammonium hydroxide (TMAOH), TMAOH with a surfactant such as cetyl trimethyl ammonium bromide, aqueous KOH, choline, or tetrabutylammonium hydroxide. For dielectric applications, the metallic ion-containing solutions should be avoided.

To cure the polyimides for dielectric applications, the films are baked after exposure at several temperatures to remove solvent and to imidize the polymer. The resistivity of BTDA-BAPS/4APS is unaffected by the presence of sensitizer or Novolac, and for the unexposed and undeveloped polyimide resist is in the range of $10^{16}$ ohm cm. Exposing the coating to developer prior to the final bake is not detrimental to the dielectric properties, as water that is added in the development step is removed in baking stages. AC and DC dielectric properties are given in the examples.

Figure 3:
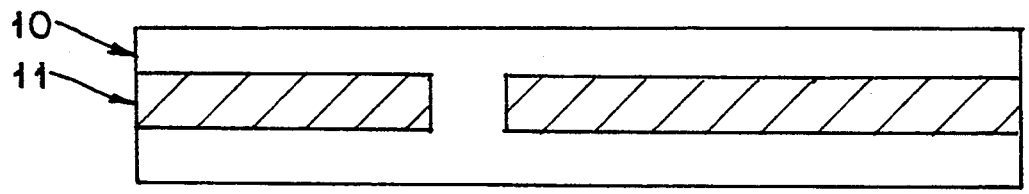
FIG. 3 is an illustration of positive polyimide layer 11, for use as a multilevel isolation between multi-level metal layers 10.

A primary application of the polyimide-based resist is to provide dielectric insulation between multilevel metal structures on an integrated circuit. In one application shown in FIG. 3, the polyimide is used as a single-layer dielectric coating what would not require a top layer of photoresist to be patterned. In a second application, the insulating layer would be a sandwich structure of polyimide and oxide shown in FIG. 4.

Figure 4:
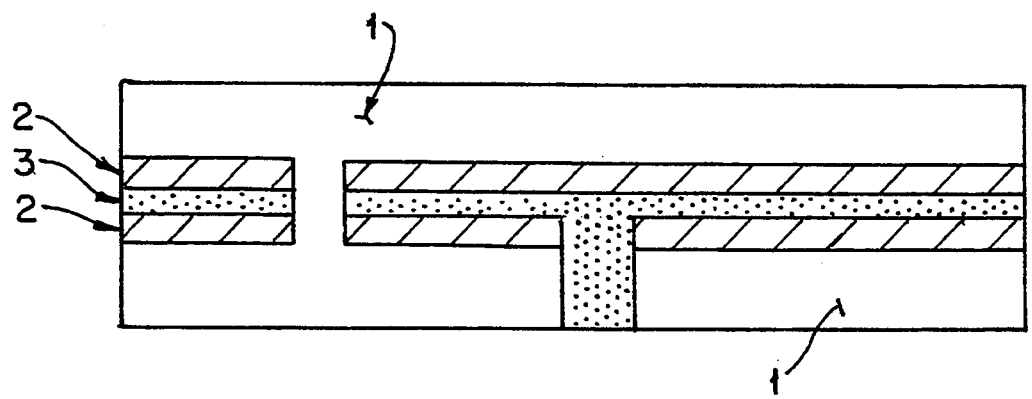
FIG. 4 is an illustration of positive polyimide layers 2, and silicon dioxide layer 3, for use as a multilevel isolation between multilevel metal layers 1.

In the application shown in FIG. 4, the imagable polyimide would take the place of photoresist which would be necessary to image the metal or oxide layers. Following imaging, however, the polyimide resist would not be stripped but would remain a part of the device. When in combination with an oxide layer, the polyimide-oxide-polyimide sandwich structure is expected to be less susceptible to cracking due to mismatch of the thermal expansion coefficients of the metal and oxide. The sandwich structure in FIG. 4 would have fewer failures due to pinholes because of the presence of three separate insulating layers.

If silicon-containing polyimide solutions are used, the polyimide can function as a dry etch mask over the top layer of a two-layer resist structure. The lower layer serves either to level underlying topography, or to provide dielectric insulation. In the latter application, the polyimide resist has an advantage in that its removal after etching is not required.

Variations of the polyimide-based resist or its processing can produce materials suitable for thick-film coatings for hybrid circuits, thick-film photoresists, passivation coatings, and heat-resistant photoresists (for applications as a reactive ion etch mask or an ion implantation mask).

The invention will be further understood by reference to applicants' examples included herein.

EXAMPLE 1

This example reproduces Example 1 of EPO Patent Application No. 224 680.

A polyamic acid was prepared by mixing 20 g 4,4'-oxydianiline, 21.36 g pyromellitic dianhydride, 98 milliliters of N-methylpyrrolidone, and 79 milliliters of 2-ethoxyethanol (Cellosolve). A photoresist composition was prepared by mixing 20 g of the above polyamic acid and 0.524 g of 2,3,4-trihydroxybenzophenone, 1,2-naphthoquinone-(diazide-2)-5-sulfonate (mixture of esters) containing a minimum of 75% triesters (hereafter designated as 215THBP). The photoresist was diluted with dimethylformamide in order to get coatings of 2 micrometers when spun onto silicon dioxide wafers. To improve adhesion of the film to the wafer, APX-K1 adhesion promoter (from Brewer Science, Inc.) was precoated. The solvent was removed after spin coating by prebaking the wafers at 95° C. for 25 minutes. The photoresist was exposed for 90 seconds through a high resolution test mask with a 200 watt medium pressure mercury arc lamp operated at and incident intensity of 4,450 microwatts/cm$^2$.

The wafers were developed in 0.23 N KOH for 1 to 60 seconds at 25° C.

Both exposed and unexposed areas dissolved in the developer in a few seconds. No patterns were observed during development.

EXAMPLE 2

This example substantially reproduces the examples in U.S. Pat. No. 4,093,461, except that a commercially available sensitizer is used.

A photoresist composition was prepared by mixing 20 grams of the above polyamic acid solution and 0.738 g of THBP sensitizer. This photoresist was diluted with dimethylformamide in order to obtain coatings of 1.2 micrometers when spun onto silicon wafers. To improve adhesion of the film to the wafer, APX-K1 adhesion promoter was precoated. The solvent was removed after spin coating by prebaking the wafers at 80° C. for 1 hour. The photoresist film was exposed through a high resolution test mask with a 200 watt medium pressure mercury arc lamp. The incident intensity used was 4,450 microwatts/cm$^2$ and the exposure time was 35 seconds.

Films were developed in diethylaminoethanol diluted with water at 1:15 v/v basis for 5 to 20 seconds at 25° C. Both exposed and unexposed areas dissolved in the developer in a few seconds. No patterns were visible in the film during development.

EXAMPLE 3

A positive-working thermally stable photoresist composition was prepared in the following way:

A polyamic acid was prepared using 3,3',4,4'-benzophenone tetracarboxylic dianhydride (BTDA), 4-aminophenyl sulfone (4APS), and bis-4-(4-aminophenoxy)phenyl sulfone, (BAPS). The molar ratio between diamines 4APS/BAPS was 0.55/0.45, while the molar ratio between dianhydride and total diamines was 0.8/1.0. This polyamic acid was synthesized using a mixture of solvents diglyme/dimethylformamide (60/40 be weight) with a solid content of 25%. The weight average molecular weight was 60,000 and the number average molecular weight was 30,000.

A diazoquinone photosensitizer was incorporated in the mixture of the polyamic acid-novolac solution in a concentration range between 10 to 20% by weight of the solids. This solution was diluted with diglyme/DMF (60/40 by weight) in order to form films of 1 micrometer thick when spin-coated between 3000 to 5000 rpm for 60 seconds and baked at 130° or 135° C. for 2 minutes on a hot plate.

The positive thermally stable photoresist solution prepared in this way was applied to the surface of a silicon wafer which had been coated previously with a solution of 0.075% methacryloxypropyltrimethoxysilane and 0025% of N-[-3-(triethoxysilyl) propyl]-4,5-dihydroimidazole adhesion promoter by means of a spin coating process at 5000 rpm for 30 sec and baked at 115° C. for 30 seconds. The photoresist-coated wafer was partially imidized by a prebake of 130° or 135° C. for 2 minutes on a hot plate. The photoresist film is exposed through a pattern mask with a mercury lamp of a wavelength of 365 nm with a dose of 150 mJ/cm$^2$.

The exposed film was developed in a solution of MF-312 (a solution containing 5% of tetramethyl ammonium hydroxide produced by Shipley Company, Inc.) diluted with deionized water 1/1 by volume for 10 to 15 seconds to resolve 5 micrometer line and space geometries.

EXAMPLE 4

A positive thermally stable photoresist formulation was prepared using the same base polyamic as in Example 1 mixed with 10% by weight of solids of Cyracure UVR 610O, a cylic aliphatic diepoxide manufactured by Union Carbide. The resist was spun, baked, and patterned as in Example 1. The exposed film could be developed in A-Z-327 MIF developer (a solution containing 5% of tetramethyl ammonium hydroxide and a surfactant) for 5 seconds to resolve 1.7 micrometer line and space geometries with good edge definition. An alternate developer as MF-312 diluted with deonized H20 (1/1 by volume) mixed with 0.05% or 0.1% by weight of Cetyl trimethyl ammonium bromide. Sensitivity was 70 mJ/cm$^2$. The volume resistivity of the fully cured photosensitive polyimide was $1 \times 10^{16}$ ohm cm at an electric field of $1 \times 10^5$ V/cm. The dielectric strength was greater than $5 \times 10^5$ volt/cm. The dissipation factor was 0.003 (1 KHz) and the dielectric constant was 2.7.

EXAMPLE 5

A positive thermally stable photoresist formulation was prepared using the same base polyamic acid as above mixed with a novolac resin (acid-catalyzed condensation product of o-cresol 2-t-butylphenol formaldehyde oxalic acid dihydride). The concentration of Novolac incorporated was about 10% by weight of the solids of the polyamic acid. The resist was spun, baked, and patterned as in Example 1. Two micrometer line and space geometries in a one micrometer film were resolved after 10 seconds of development. The volume resistivity of the fully cured photosensitive polyimide was $3 \times 10^{16}$ ohm cm at an electric field of $1 \times 10^5$ V/cm. The dielectric strength was greater than $5 \times 10^5$ volt/cm. The dissipation factor was 0.003 (1 KHz) and the dielectric constant was 2,7. The film had a 20% thickness loss following baking at 350° C. for 30 minutes under nitrogen atmosphere.

EXAMPLE 6

A positive thermally stable photoresist composition was prepared in the following way:

Polyamic acid was synthesized as in Example 1 and was mixed with 0.3-2% of one of the following compounds; diisopropyl amine, trihexyl amine, dibenzyl amine, N-( triethoxysilylpropyl)-urea, p-dimethylamino benzaldehyde, or isocyanatopropyl triethoxysilane.

After addition of one of these components, 215THBP sensitizer was added to the solution in a concentration of 15 to 20% of solids. The films were spun, exposed, and developed as in Example 1. The resulting patters had resolution of 2 micrometer lines and spaces with good edge profiles.

EXAMPLE 7

The polyamic acid of Example 1 was mixed with 1% of a 50% solution of a polyurethane in N-methylpyrrolidone. The polyurethane was synthesized by condensing ethylene glycol with methylene diisocyanate. The polymer was patterned as before to produce positive-working patterns.

EXAMPLE 8

A polyamic acid was prepared using 3,3',4,4'-biphenyltetracarboxylic dianhydride (BPDA), 4-aminophenyl sulfone (4APS), and bis (4-[4 amino phenoxy] phenyl sulfone) (BAPS). The molar ratio between amines 4APS/BAPS was 0.55/0.45, and the molar ratio between dianhydride and total diamines was 1/1. The solvent-used was a mixture of giglyme and dimethylformamide in a ratio of 60/40 by weight. The solids content was about 20%.

A photoresist was prepared by mixing the above polyamic acid and 215THBP sensitizer in a concentration of about 30% of the polyamic acid solids. The coating process was the same described in Example 1. The prebaking temperature was also about 130° to 135° C. for 2 minutes on a hot plate. The exposure dose was 100 mJ/cm$^2$, and the developer used was a solution of MF312 diluted with water 1/1 by volume. Five micrometer line and space geometries were obtained in 1 micrometer film thickness after 10 minutes of development.

A lower molecular weight modification of the above polyamic acid was synthesized by reducing the mole ratio to 0.8/1. This polyamic acid was mixed with 20% of 215THBP sensitizer (by weight of the polyamic acid), spin coated onto silicon wafers, and baked at the same conditions described in example 1. The film was then exposed at 140 mJ/cm$^2$, and developed with the same developer solution as in Example 1 for 8 minutes. The line and space geometries obtained were up to 5 micrometers in 1 micrometer thick film.

EXAMPLE 9

A thick-film positive-working polyimide resist was prepared in the following manner:

A polyamic acid was synthesized as in Example 1 except that the percent solids was 30%. Sensitizer (20% by weight of polyamic acid) and Novolac (10% by weight of polyamic acid) were added. The resist was spun and patterned as in example 1. In a six micron coating, 10 micron lines were obtained.

It will be appreciated by those skilled in the art that variations in the invention disclosed herein may be made without departing from the spirit of the invention. The invention is not to be limited by the specific embodiments disclosed herein but only by the scope of the claims appended hereto.

What is claimed is:

1. A multilevel metal or oxide article of manufacture on an integrated circuit having a photoimaged dielectric insulation between the metal or oxide levels said dielectric insulation comprising:

a. the condensation product of an aromatic dianhydride and an aromatic di-primary amine having from about 10 to about 50 mole percent of the di-primary amine having the formula:

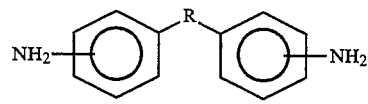

where R contains one or more phenyl rings connected by oxygen, SO$_2$, alkyl, fluoroalkyl, or biphenyl linkages; and b. a diazoquinone photoactive sensitizer; and whereby the dielectric insulation is characterized by less tendency to outgas to form pinholes, greater solubility difference between exposed and unexposed regions, unexposed and undeveloped regions having resistivity in the range of $1 \times 10^{16}$ ohm cm., a dielectric strength greater than $5 \times 10^5$ volt/cm, while also having less susceptibility to cracking due to mismatch of thermal coefficients, and the dielectric insulation serving as a photoresist which need not be removed after imaging.

2. The article of claim 1 wherein the diepoxide is 3, 4 epoxycyclohexylmethyl-3', 4'-epoxycyclohexane carboxylate.

3. The article of claim 1 further comprising from 10 to 20 solids weight percent of a material selected from the group consisting of novolac resin, dimethylaminobenzaldehyde, diisopropyl amine, trihexyl amine, dibenzyl amine, N-(triethoxysilylpropyl)urea, p-dimethylamino benzaldehyde, isocyanatopropyl-triethoxysilane and mixtures thereof.

4. The article of claim 1 further comprising from 1% to about 12% by weight of a compound selected from the group consisting of polyurethanes and cycloaliphatic diepoxides.

* * * * *